(12) United States Patent
Kuzmenka et al.

(10) Patent No.: US 7,414,435 B2
(45) Date of Patent: Aug. 19, 2008

(54) CIRCUIT ARRANGEMENT AND METHOD FOR CONVERTING LOGIC SIGNAL LEVELS AND USE OF THE CIRCUIT ARRANGEMENT

(75) Inventors: Maksim Kuzmenka, Munich (DE); Aaron Nygren, Munich (DE)

(73) Assignee: Qimonda AG, Munich (DE)

( * ) Notice: Subject to any disclaimer, the term of this patent is extended or adjusted under 35 U.S.C. 154(b) by 20 days.

(21) Appl. No.: 11/638,089

(22) Filed: Dec. 13, 2006

(65) Prior Publication Data

US 2008/0054940 A1    Mar. 6, 2008

(30) Foreign Application Priority Data

Dec. 16, 2005    (DE) .................. 10 2005 060 347

(51) Int. Cl.
*H03K 19/0175* (2006.01)
(52) U.S. Cl. .................... 326/81; 326/68; 326/86; 327/109; 327/333
(58) Field of Classification Search .......... 326/63, 326/68, 80–83, 86, 112, 115, 119, 121; 327/108–109, 327/333
See application file for complete search history.

(56) References Cited

U.S. PATENT DOCUMENTS

| | | | | |
|---|---|---|---|---|
| 5,781,026 A | * | 7/1998 | Chow | 326/26 |
| 6,043,699 A | * | 3/2000 | Shimizu | 327/333 |
| 6,304,069 B1 | | 10/2001 | Tatsumi | |
| 6,396,329 B1 | * | 5/2002 | Zerbe | 327/336 |
| 6,943,585 B2 | * | 9/2005 | Lee et al. | 326/58 |
| 7,112,996 B2 | * | 9/2006 | Lee | 326/68 |
| 7,205,820 B1 | * | 4/2007 | Yeung et al. | 327/333 |
| 7,279,934 B2 | * | 10/2007 | Do | 326/83 |
| 2005/0134314 A1 | | 6/2005 | Prather et al. | |
| 2005/0174149 A1 | | 8/2005 | Hu | |

FOREIGN PATENT DOCUMENTS

| | | |
|---|---|---|
| DE | 102 50 936 B3 | 4/2004 |
| DE | 10 2004 020 987 A1 | 2/2005 |
| DE | 103 57 495 A1 | 7/2005 |
| JP | 7231252 A | 8/1995 |

* cited by examiner

*Primary Examiner*—Rexford Barnie
*Assistant Examiner*—Jason M Crawford
(74) *Attorney, Agent, or Firm*—Slater & Matsil, L.L.P.

(57) ABSTRACT

A circuit arrangement for converting logic signal levels has a level converter and a mixing arrangement for influencing a pulse width. The level converter includes a first signal path and a second signal path each having a series circuit comprising two transistors of different conductivity types and two outputs which are each connected to a tap between the transistors which are coupled in series. In this case, the transistors of one conductivity type can be controlled by means of a push-pull signal and the transistors of the other conductivity type in a respective one of the two signal paths can be controlled by means of a signal at the output of the respective other signal path. The mixing arrangement includes two inputs and two outputs, the first input being coupled to the first output and the second input being coupled to the second output. In addition, the first input is coupled to the second output via at least one inverter and the second input is coupled to the first output via at least one further inverter.

14 Claims, 7 Drawing Sheets

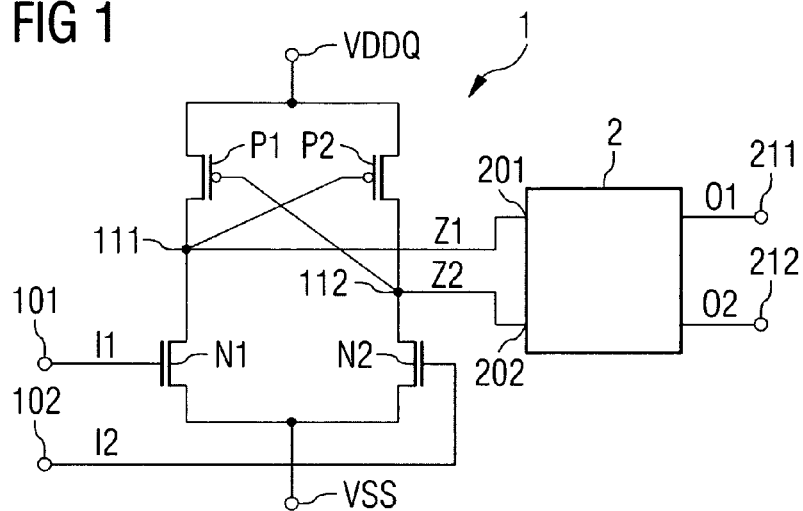
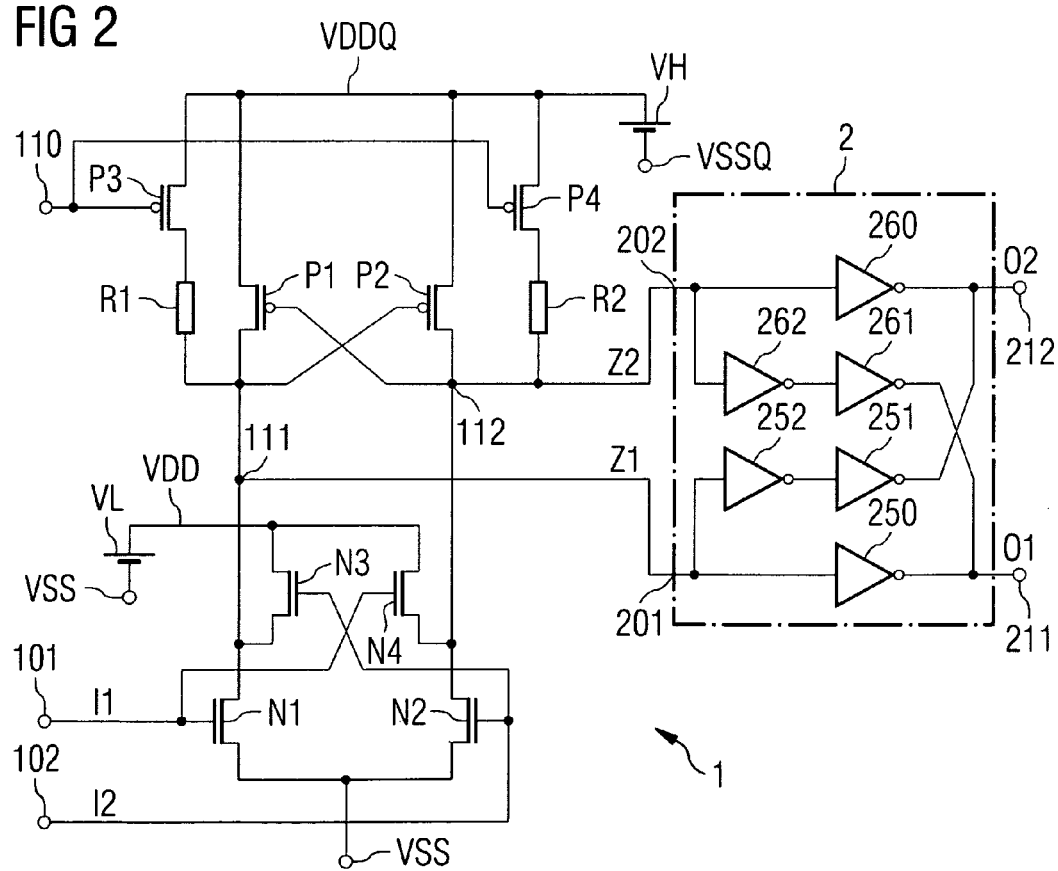

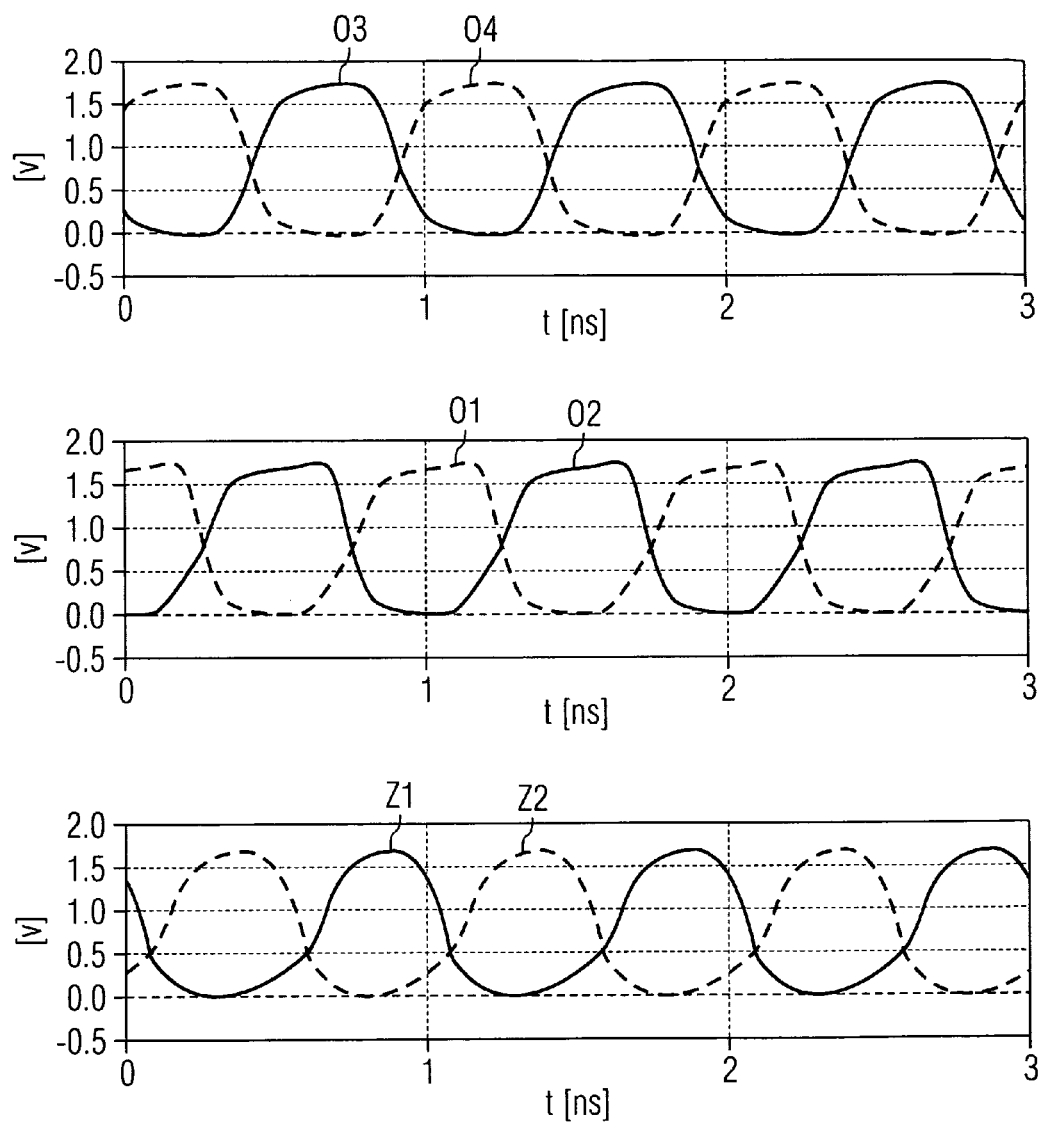

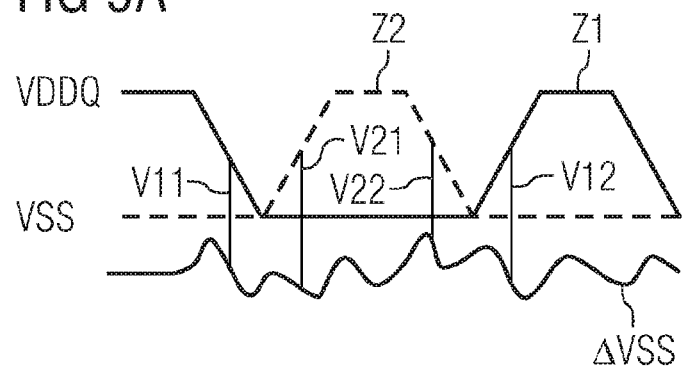
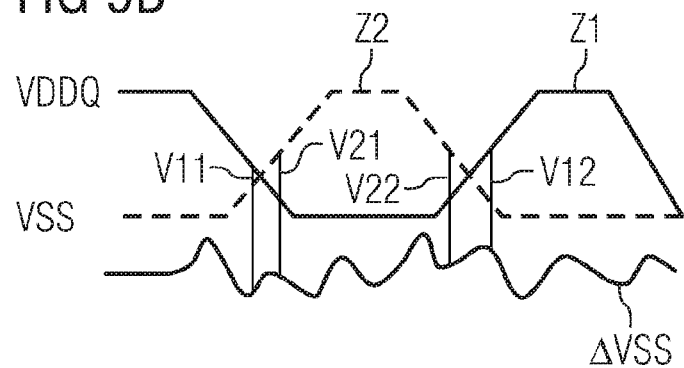
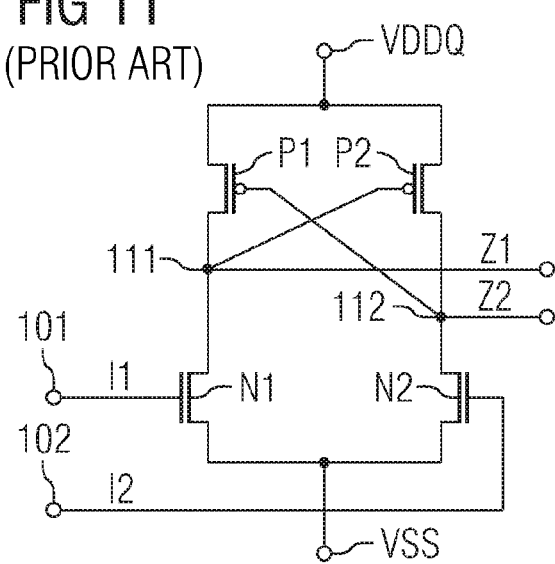

US 7,414,435 B2

CIRCUIT ARRANGEMENT AND METHOD FOR CONVERTING LOGIC SIGNAL LEVELS AND USE OF THE CIRCUIT ARRANGEMENT

This application claims priority to German Patent Application 10 2005 060 347.5, which was filed Dec. 16, 2005, and is incorporated herein by reference.

TECHNICAL FIELD

The invention relates to a circuit arrangement and to a method for converting logic signal levels and to a use of the circuit arrangement in a semiconductor memory.

BACKGROUND

Level converters are frequently used in an electronic circuit to convert the level of logic signals from a region of the circuit which is supplied by a first supply voltage and to forward them to a circuit region which is supplied by another supply voltage. One use of such circuits is in dynamic semiconductor memories (Dynamic Random Access Memories (DRAMs)). In this case, the circuit regions inside the semiconductor memory are operated, for example, with a supply voltage of 1.5 V, while the circuit regions which are arranged on the output side are operated with a supply voltage of 2.1 V.

A fundamental demand imposed on such a level converter is that a logic signal is not delayed as far as possible and a high operating frequency can be complied with. In addition, signal characteristics, in particular the duty ratio of the logic signal to be converted, such as the ratio between the high and low phases of the signal, should not be changed as far as possible.

FIG. 11 shows a conventional level converter. The level converter, which is designed using CMOS technology that is nowadays customary, has two signal paths which are connected between a supply potential connection VDDQ and a reference potential connection VSS. The signal paths each comprise an n-channel field effect transistor N1, N2, whose control connections simultaneously constitute the signal input 101 and 102 of the level converter, and a p-channel field effect transistor P1 and P2 whose control inputs are each cross-coupled to the other signal path. The signal inputs 101 and 102 are used to supply a push-pull signal having a first voltage swing to the level converter, said push-pull signal being composed of a first signal component I1 and a second signal component I2, and the second signal component I2 having a signal level that is complementary to the first signal component I1. The signal paths are thus driven in a complementary manner to one another. Logic signals having a second voltage swing can be tapped off at the outputs 111 and 112 of the level converter.

On account of the customary dimensions of the n-channel and p-channel field effect transistors, the logic levels of the output signals Z1 and Z2 of the level converter are no longer completely complementary to one another. This is illustrated, for example, in FIG. 12 using a signal/time diagram of the input and output signals of the level converter. The pulsed signals I1 and I2, for instance corresponding to a clock signal in this case, are applied to the inputs 101 and 102 of the level converter. The voltage swing corresponds to the first voltage range in the form of a difference between a first supply voltage VDD and a first reference voltage VSS. The output signals Z1 and Z2 have a second voltage swing which, in accordance with the second voltage range, results as the difference between a second supply voltage VDDQ and a second reference voltage VSSQ.

If the input signal I1 has a rising edge, the level of the output signal Z1 begins to fall after the high level has been reached by the input signal I1, that is to say with a certain delay by the transistor N1. Upon switching in the opposite direction, the p-channel field effect transistor P1 is first of all influenced by the cross-coupling to the other signal path and the output voltage Z1 begins to rise to the high level only after the transistor P1 has been completely switched. This corresponds approximately to a delay by two transistors. A similar situation applies to the derivation of the output signal Z2. In the case of the two output signals Z1 and Z2, the duration of the low level is now clearly longer than the duration of the high level, which corresponds to a change in the duty ratio (duty cycle).

This distortion of the duty ratio may result in the functionality of an integrated circuit being adversely affected, in particular at high switching frequencies. In addition, such a temporal discrepancy can be caused by a prescribed clock signal, so-called jitter.

SUMMARY OF THE INVENTION

In one embodiment, a circuit arrangement for converting logic signal levels comprises a level converter and a mixing arrangement for influencing a pulse width. The level converter has a first signal path and a second signal path each having a series circuit comprising a transistor of a first conductivity type and a transistor of a second conductivity type. A push-pull signal can be supplied via a first signal input and a second signal input. Output signals of the level converter can also be tapped off via a first output and a second output which are each connected to a tap between the transistors which are connected in series. The transistors of the first conductivity type can be controlled by means of the push-pull signal in the level converter, while the transistors of the second conductivity type in a respective one of the two signal paths can be controlled by means of a signal at the output of the respective other signal path.

The mixing arrangement comprises a first input which is coupled to the first output of the level converter, a second input which is coupled to the second output of the level converter, and a first signal output and a second signal output for tapping off output signals. In the mixing arrangement, the first input is coupled to the first signal output and the second input is coupled to the second signal output. Furthermore, the first input is coupled to the second signal output via at least one inverter and the second input is coupled to the first signal output via at least one further inverter.

A third signal path can be connected between the output of the first signal path and a second supply potential connection and has a first resistor and a further transistor which is connected in series and has a control input that is connected to an activation input. In a similar manner, provision may be made of a fourth signal path which is connected between the output of the second signal path and the second supply potential connection and has a second resistor and a further transistor which is connected in series and has a control input that is connected to the activation input.

In one exemplary embodiment of a method for converting logic signal levels, a pulsed push-pull signal having a first voltage swing is supplied. The push-pull signal is converted into a first pulsed intermediate signal and into a second pulsed intermediate signal each having a second voltage swing. In this case, a supply voltage that is used for conversion is provided to a resistor based as a function of an activation signal. A first pulsed output signal having the second voltage swing is derived from the first intermediate signal, a pulse width of the first output signal being influenced by a pulse width of the second intermediate signal. In a similar manner to this, a second pulsed output signal having the second voltage swing is derived from the second intermediate signal, a pulse width of the second output signal being influenced by a pulse width of the first intermediate signal.

BRIEF DESCRIPTION OF THE DRAWINGS

The invention will be explained in detail below using exemplary embodiments and with reference to the drawings, in which:

FIG. 1 shows a first exemplary embodiment of the proposed circuit arrangement;

FIG. 2 shows a second exemplary embodiment of the proposed circuit arrangement;

FIG. 8 shows a signal/time diagram for signals within the proposed circuit arrangement;

FIG. 9A shows a signal/time diagram for intermediate signals without using the proposed principle;

FIG. 9B shows a signal/time diagram for intermediate signals using the proposed principle;

FIG. 11 shows one known embodiment of a level converter; and

DETAILED DESCRIPTION OF ILLUSTRATIVE EMBODIMENTS

Figure 3:
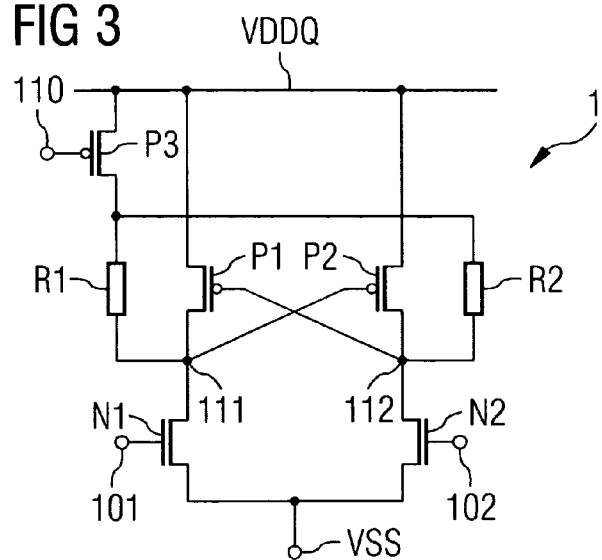
FIG. 3 shows one exemplary embodiment of the proposed level converter.

Further aspects and embodiments of the present invention are summarized in the following description. In addition, reference is made to the accompanying figures which form part of the description and in which illustrations are used to show how the invention can be implemented in practice. The embodiments of the drawings represent a summary in order to enable better understanding of one or more aspects of the present invention. This summary is not a comprehensive overview of the invention and does not intend to restrict the features or key elements of the invention to a particular embodiment. Rather, the different elements, aspects and features which are disclosed in the exemplary embodiments can be combined in different ways by an informed person in order to achieve one or more advantages of the invention.

Both embodiments could be used and structural or logical changes could be made without departing from the central idea of the present invention. The elements in the drawings are not necessarily true to scale with respect to one another. In this case, functionally identical and operatively identical elements bear the same reference symbols.

In one exemplary embodiment, a push-pull signal can be supplied to the level converter as an input signal via the first and second signal inputs. The push-pull signal is composed, for example, of two pulsed signal components which have the same voltage swing from a first voltage range but whose signal levels are complementary to one another with regards to a reference level. The push-pull signal is used to directly drive the transistors of the first conductivity type and to indirectly drive the transistors of the second conductivity type. Transistors of the same conductivity type are understood as meaning field effect transistors of the same channel type or else bipolar transistors having the same majority charge carriers. Intermediate signals which have a second voltage swing from a second voltage range are present at the outputs of the level converter. The signal levels of the intermediate signals no longer need to be completely complementary to one another.

The mixing arrangement processes the intermediate signals to form output signals having the second voltage swing. As a result of the fact that the inputs and outputs of the mixing arrangement are coupled in the described manner, the pulse width of the output signals is respectively influenced both by the pulse width of the first intermediate signal and by the pulse width of the second intermediate signal. For example, the pulse width of a high level of the first intermediate signal is narrower than a pulse width which is prescribed by a clock signal, for instance. At the same time, the pulse width of a low level of the second intermediate signal is wider than the prescribed pulse width. One of the inverters, which are supplied with a voltage from the second voltage range, can be used to derive a signal having a complementary signal level. Combining the first intermediate signal having the narrow pulse width and a signal having a signal level that is complementary to the second intermediate signal and having the wide pulse width then makes it possible to generate an output signal having a pulse width which corresponds, for example, to the pulse width prescribed by the clock signal. In a similar manner to this, a second output signal can also be generated from the second intermediate signal and from a signal that is derived from the first intermediate signal. This results in smaller temporal discrepancies in a push-pull signal that is applied to the input of the level converter and in an improved switching behavior.

FIG. 1 shows one exemplary embodiment of a circuit arrangement having a level converter 1 and a mixing arrangement 2. The level converter 1 has two signal paths which are connected to a supply potential connection VDDQ and to a reference potential connection VSS. The signal paths respectively comprise an n-channel field effect transistor N1 and N2 and a p-channel field effect transistor P1 and P2. The control connections of the transistors N1 and N2 are connected to the signal input 101, 102. They are used to supply the input signal I1 and I2 in the form of a push-pull signal. The level converter has two signal outputs 111 and 112 which can be used to tap off the intermediate signals Z1 and Z2. The control connections of the transistors P1 and P2 are cross-connected to the output 111 and 112 of the respective other signal path. The intermediate signals Z1 and Z2 are supplied to the mixing arrangement 2 via the inputs 201 and 202. The output signals O1 and O2 can be tapped off at the signal outputs 211 and 212.

The push-pull signal I1 and I2 at the input 101 and 102 of the level converter 1 comes from a first voltage range and has a first voltage swing which generally approximately corresponds to the supply voltage of the first voltage range. Supplying the level converter 1 with the supply voltage VDDQ of the second voltage range converts the push-pull signal I1 and I2, which is formed from the signal components I1 and I2, into the intermediate signals Z1 and Z2 having the second voltage swing. The method of operation of the level converter 1 largely corresponds to that of a known level converter. As a result, the intermediate signals Z1 and Z2 are no longer completely complementary to one another since the pulse width of the intermediate signals Z1 and Z2 has changed in comparison with the input signals I1 and I2. In the mixing arrangement 2, the intermediate signals Z1 and Z2 influence the output signals O1 and O2 in such a manner that an excessively narrow pulse width at a high level of the first intermediate signal is compensated for by an excessively wide pulse width at a low level of the inverted second intermediate signal. As a result, the pulse width of the output signals O1 and O2 is corrected to the value which the input signals I1 and I2 originally had. The switching behavior of the circuit arrangement is therefore advantageously improved.

FIG. 2 shows another exemplary embodiment of the circuit arrangement. As an extension to the exemplary embodiment of FIG. 1, the level converter 1 has two further n-channel field effect transistors N3 and N4. The source connection of the transistor N3 is connected to the output 111 of the first signal path and the source connection of the transistor N4 is connected to the output 112 of the second signal path. The drain connections of both transistors N3 and N4 are coupled to a supply potential connection VDD. The voltage for this supply potential connection VDD from the first voltage range is provided by a voltage source VL. The control connections of the transistors N3 and N4 are each connected to the signal input 101 and 102 of the other signal path, with the result that the transistor N3 on the first signal path is driven by the input signal I2 and the transistor N4 on the second signal path is driven by the input signal I1. The two transistors N3 and N4 are thus connected in the so-called source follower mode and help to ensure a changeover in the level converter 1 if the voltage difference between the first supply potential connection VDD and the second supply potential connection VDDQ is too large.

A resistor R1 is also connected in series with a transistor P3 between the output 111 of the first signal path and the second supply potential connection VDDQ. In the same manner, a series circuit comprising a resistor R2 and a transistor P4 is arranged between the output 112 of the second signal path and the second supply potential connection VDDQ. The control connections of the transistors P3 and P4 are connected to an activation input 110. The voltage at the second supply potential connection VDDQ is provided by a voltage source VH.

If, with a corresponding activation signal at the activation input 110, the transistors P3 and P4 are in an on state and the resistors are consequently conductively connected to the second supply potential connection VDDQ, the transistors N1 and N2 can be directly supplied with current, upon a respective changeover to the on state, without having to wait for delayed activation of the transistors P1 or P2. This makes it possible for the level of the intermediate signals Z1 and Z2 at the outputs 111 and 112 of the level converter 1 to be converted more rapidly. However, in an energy-saving mode, the operation of rapidly supplying current to the transistors N1 and N2 via the resistors R1 and R2 can be deactivated by means of a corresponding signal at the activation input 110, namely by switching the transistors P3 and P4 to an off state. In other words the circuit arrangement can be operated in two modes of operation, namely a normal mode of operation and an energy-saving mode, depending on the activation signal.

In the mixing arrangement 2, the first signal output 211 is coupled to the first input 201 via an inverter 250 and is coupled to the second input 202 via two inverters 261 and 262 which are connected in series. In a similar manner, the second signal output 212 is connected to the second input 202 via an inverter 260 and is connected to the first input 201 via the inverters 251 and 252. All of the inverters in the mixing arrangement 2 are supplied with a voltage from the second voltage range, that is to say by the second supply potential connection VDDQ.

Ideally, the intermediate signals Z1 and Z2 should have signal levels that are complementary to one another. In this case, the second intermediate signal Z2 would be obtained by inverting the first intermediate signal Z1. However, this dependency of the intermediate signals Z1 and Z2 on one another can also be used in the case of signals which are only partially complementary to one another. The intermediate signals are thus supplied to a signal output having a different number of inverters. In one of the signals, the pulse width is then generally too narrow and, in the other signal, the pulse width is too wide, based respectively on the pulse width of the originally applied input signal I1 and I2. However, in the case of the two signals which are supplied to the signal output 211 and 212 of the mixing arrangement 2, the signal level is the same. The output signal O1 and O2 which has been mixed from the signals then again has a pulse width which corresponds to the input signal I1 and I2.

In addition to providing the logic function, the inverters are also used as current buffers. The inverters thus make it possible to also improve the current-carrying capacity of the circuit arrangement. Since a certain current-carrying capacity is expected from such a circuit arrangement, it may be necessary to connect logic elements downstream for the purpose of current buffering. An additional slight temporal delay caused by the inverters is thus no longer noticeable either since other logic elements also entail a comparable time delay.

FIG. 3 shows another exemplary embodiment of the level converter. The resistors R1 and R2, which are provided in the level converter 1 for the purpose of supplying the transistors N1 and N2 with current in a more rapid manner, are connected to the second supply potential connection VDDQ via a common transistor P3. Only a single transistor P3 is thus needed to connect or disconnect the resistors R1 and R2. In other words, only one transistor P3 is needed to switch between the normal mode of operation and the energy-saving mode of operation.

Figure 4:
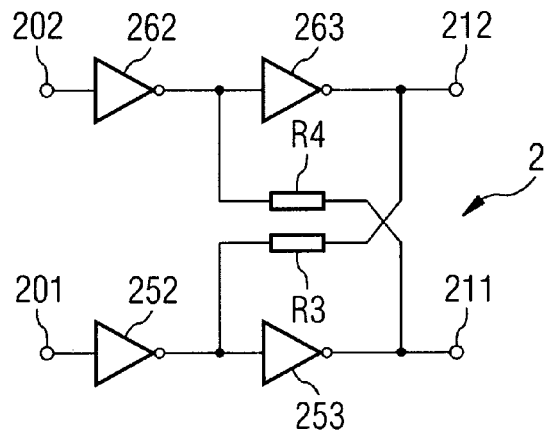
FIG. 4 shows a first exemplary embodiment of the proposed mixing arrangement.

FIG. 4 shows an exemplary embodiment of a mixing arrangement 2 as an alternative to the mixing arrangement 2 shown in FIG. 2. The first signal output 211 is connected to the first input 201 via two inverters 252 and 253 and is connected to the second input via an inverter 262 and a resistor R4. The second output 212 is coupled to the second input 202 via the inverters 262 and 263 and is coupled to the first input 201 via the inverter 252 and the resistor R3.

The connections between an output and the two inputs 201 and 202 again have a different number of inverters. As a result, one of the output signals O1 or O2 can be derived from the intermediate signals Z1 and Z2, as shown in FIG. 2, having the signal levels which are only partially complementary to one another.

Figure 5:
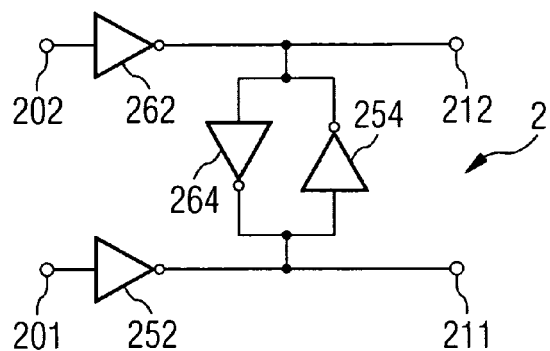
FIG. 5 shows a second exemplary embodiment of the proposed mixing arrangement.

FIG. 5 shows another embodiment of a proposed mixing arrangement 2. The first signal output 211 is first of all coupled to the first input 201 via an inverter 252 and the second signal output 212 is coupled to the second input 202 via an inverter 262. Two inverters 254 and 264 which are connected back to back are connected between the signal outputs 211 and 212. This embodiment also makes it possible to mix the intermediate signals Z1 and Z2 to form output signals O1 and O2 having a pulse width that corresponds to the input signals I1 and I2.

Figure 6:
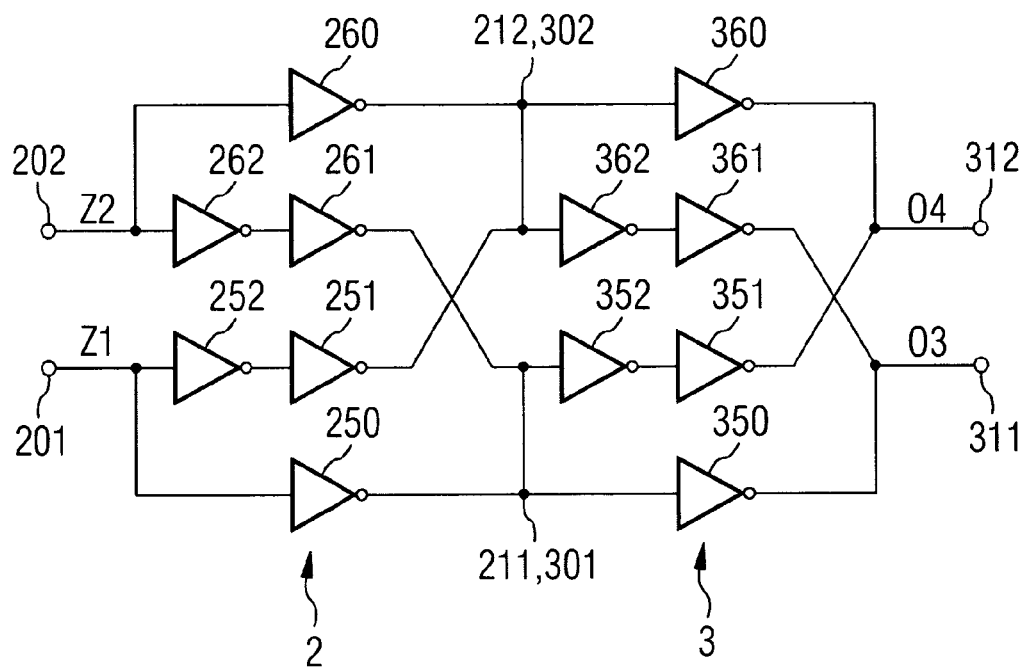
FIG. 6 shows one exemplary embodiment of the series-connection of two proposed mixing arrangements.

FIG. 6 shows one embodiment in which two mixing arrangements 2 and 3 are connected in series. In this case, the second mixing arrangement 3 has a first input 301 which is directly coupled to the first signal output 211 of the mixing arrangement 2, and a second input 302 which is coupled to the second signal output 212. The second mixing arrangement 3 has the same internal design as the mixing arrangement 2. A first output 311 is thus connected to the first input 301 via an inverter 350 and is connected to the second input 302 via two inverters 361 and 362. In a symmetrical design, the second output 312 is connected to the second input 302 via an inverter 360 and is connected to the first input 301 via two inverters 351 and 352.

The intermediate signals Z1 and Z2 having the distorted pulse widths which are temporally incorrect are processed by the first mixing arrangement 2 to form a signal having an improved duty ratio. If, however, the temporal discrepancies in the intermediate signals Z1 and Z2 are too large, slight deviations of the pulse widths from a desired pulse width could still occur even after the first mixing arrangement 2. These deviations can be improved further by renewed mixing using the second mixing arrangement 3, with the result at the output signals O3 and O4 that the outputs 311 and 312 of the second mixing arrangement 3 have the desired pulse widths.

In the case of extreme distortions of the duty ratio as a result of the level converter 1, an even larger number of such mixing arrangements could also be connected in series. A second downstream mixing arrangement or further downstream mixing arrangements also make it possible to increase the current-carrying capacity of the circuit arrangement.

Figure 7:
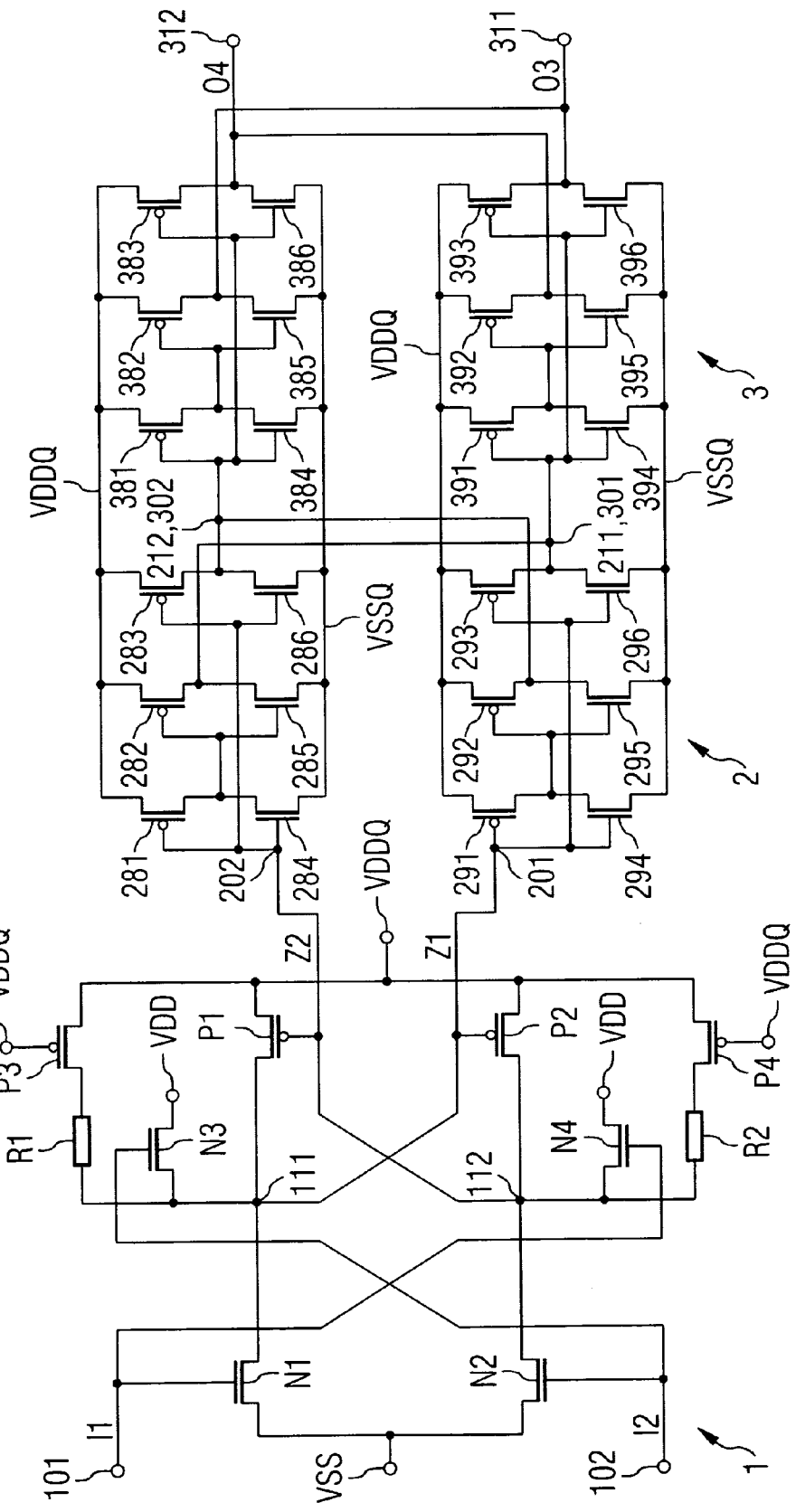
FIG. 7 shows a third exemplary embodiment of the proposed circuit arrangement.

FIG. 7 shows another exemplary embodiment of the circuit arrangement according to the invention. Two mixing arrangements 2 and 3 are connected downstream of the level converter 1. In this case, the inverters in the mixing arrangements are implemented using field effect transistors. The transistors 281 and 284, 282 and 285 and 283 and 286 thus respectively represent one of the inverters 260, 261 and 262, of FIG. 6. In this case, the design of the mixing arrangements 2 and 3 corresponds to the connection shown in FIG. 6. All of the inverters are supplied via the second supply potential connection VDDQ and the second reference potential connection VSSQ.

The improvement in the duty ratio as a result of the two mixing arrangements 2 and 3 is shown in the signal/time diagram in FIG. 8. The intermediate signals Z1 and Z2 result, at the output of the level converter 1, for a pulsed push-pull signal I1 and I2 which is not shown here and is formed like a clock signal. The duty ratio of the signals Z1 and Z2 is greatly distorted since the pulse width for the high level is considerably narrower than the pulse width for the low level. After mixing by the mixing arrangement 2, the duty ratio of the output signals O1 and O2 is clearly improved. However, if the duty ratio achieved is not good enough, the output signals O3 and O4 can be generated by means of the second mixing arrangement 3. The signal levels of the output signals O3 and O4 are virtually completely complementary to one another.

Different noise is usually noticed in dynamic memory applications with regards to the voltage supply of the different voltage ranges. This difference can be determined as the difference ΔVSS between the reference potentials VSS and VSSQ. Since the input signals I1 and I2 relate to the first reference potential VSS and the intermediate signals Z1 and Z2 relate to the second reference potential VSSQ, the voltage difference ΔVSS also becomes noticeable in the operation of the level converter 1. Because the times at which one signal rises and the other signal falls are now different from one another, different effects are observed at the output of the level converter 111 and 112. FIG. 9A shows a signal/time diagram for the intermediate signals Z1 and Z2 and the noise difference ΔVSS between the reference potentials for a conventional level converter without using the proposed principle. Ideally, the temporal profiles of the intermediate signals Z1 and Z2 should intersect in the middle of the second supply potential VDDQ since this is the time at which the transition from one level to the other is detected. If the deviation from the second reference potential ΔVSS is concomitantly included, a voltage V11 results on the falling edge of the first intermediate signal Z1 at the changeover time. However, the actual associated voltage V21 on the rising edge of the second intermediate signal Z2 is clearly larger since the voltage difference ΔVSS has assumed another value at this time. A similar situation applies to the voltage V22 on the falling edge of the second intermediate signal Z2 and the voltage V12 on the rising edge of the first intermediate signal Z1. These voltage discrepancies ultimately also result in temporal discrepancies when changing over from one level to the other, which becomes noticeable as jitter.

If the transistors N1 and N2 in the level converter 1 are directly supplied with current by means of the resistors R1 and R2 in a normal mode of operation, changeover between the levels is effected in a more rapid manner. As a result, the point at which the temporal profiles of the intermediate signals Z1 and Z2 intersect also moves closer to the middle between the second supply potential VDDQ and the reference potential VSS. This is illustrated in FIG. 9B. As a result of the smaller temporal discrepancy in the changeover times between the intermediate signals Z1 and Z2, the voltages V11 and V21 and V22 and V12 relate to a virtually identical reference potential, even including the voltage difference ΔVSS between the reference potentials. As a result, temporal discrepancies are also reduced during changeover and there is less jitter. The switching behavior of the circuit arrangement is thus improved by the use of the resistors R1 and R2.

Figure 10A:
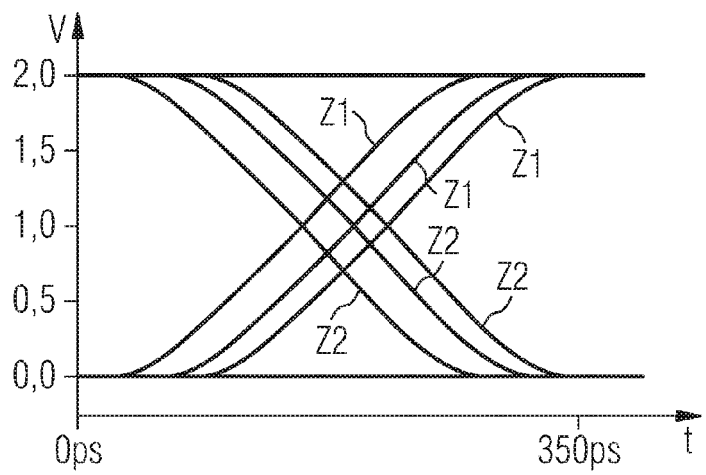
FIG. 10A shows an eye diagram without using the proposed principle.
Figure 10B:
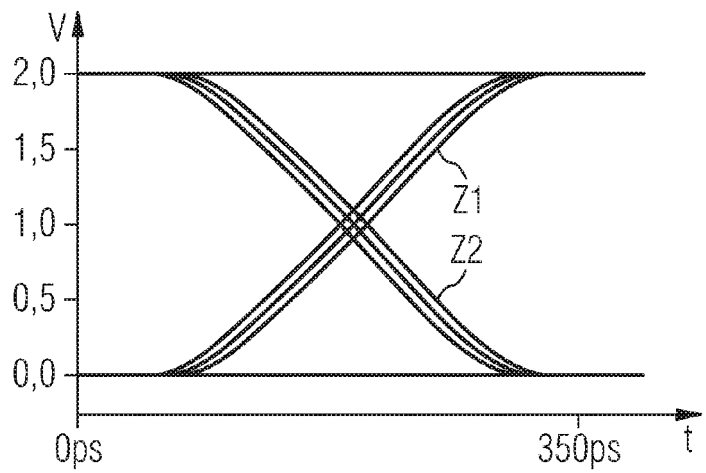
FIG. 10B shows an eye diagram using the proposed principle.
Figure 12:
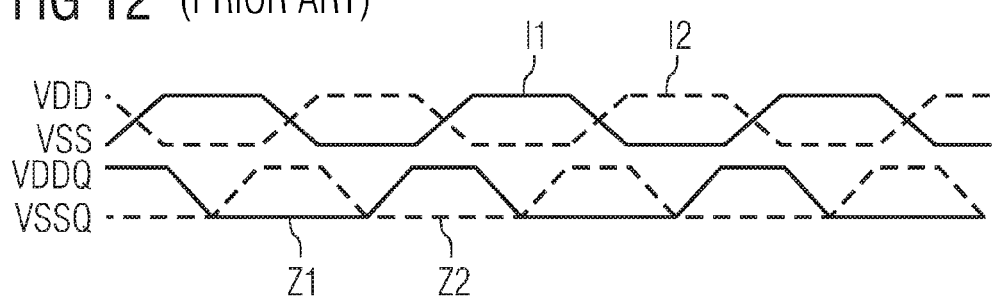
FIG. 12 shows a signal/time diagram for signals within the known level converter.

The influence of the resistors is also illustrated in the eye diagrams in FIGS. 10A and 10B. FIG. 10A shows an eye diagram of the intermediate signals Z1 and Z2 without the use of the resistors R1 and R2 in an energy-saving mode. The voltage difference ΔVSS between the reference potentials results in a fluctuation range, that is to say jitter, of approximately 60 ps for the changeover time of the intermediate signals Z1 and Z2. The eye diagram according to FIG. 10B is produced with the additional resistors R1 and R2. With the same noise ΔVSS, the jitter is reduced to less than 15 ps. The reduction in the temporal distortion becomes more important, the higher the switching frequency used. The operation of the mixing arrangement 2 is also improved by reducing the jitter since less distortion has to be compensated for.

In one exemplary embodiment, the circuit arrangement also comprises a first transistor and a second transistor of the same conductivity type. In this case, the first transistor is connected between a first supply potential connection and the output of the first signal path and the second transistor is connected between the first supply potential connection and the output of the second signal path. The first and second transistors can be controlled using the push-pull signal that is applied to the input of the level converter.

In this case, the control connection of the first transistor is preferably coupled to the second signal input and the control connection of the second transistor is coupled to the first signal input. The two transistors help to change over the level converter if the voltage difference between the first voltage range and the second voltage range is too large. As a result, the switching speed of the level converter can also be improved and the discrepancy in the pulse width at the output of the level converter can be reduced, with the result that fewer discrepancies have to be corrected in the mixing arrangement and the switching behavior is improved further.

In another embodiment, the circuit arrangement also comprises a third signal path and a fourth signal path. In this case, the third signal path is connected between the output of the first signal path and a second supply potential connection and comprises a first resistor. The fourth signal path is connected between the output of the second signal path and the second supply potential connection. It comprises a second resistor.

The second supply potential connection provides a supply voltage for the second voltage range. The reference potentials for the first and second voltage ranges need not have an identical potential. Rather, both the supply voltage from the first voltage range and the supply voltage from the second voltage range may have a small amount of noise which, however, is different, and fluctuations, that is to say noise, results between the reference potentials of the two voltage ranges. These fluctuations in the reference potential may result in temporal discrepancies when changing over from one signal level to the other, the discrepancies becoming noticeable as jitter.

This effect is intensified by virtue of the fact that rising and falling edges in the two signal paths do not take place at the same time and the signal levels thus relate to different reference voltages as a result of the noise. Connecting the resistors in parallel with the transistors of the second conductivity type make it possible for the transistors of the first conductivity type to be directly supplied with current if they are changed to an on state by the input signal. Since the current can flow virtually directly, rather than after a delay by a second transistor as in the case of the falling edge, the temporal discrepancy in the times between the rising and falling edges decrease. This also reduces the influence of a fluctuating reference voltage and there is less jitter and less distortion of the duty ratio.

In another exemplary embodiment, a respective transistor, which has a control input that is connected to an activation input, is connected in series with the first and second resistors. Since one of the transistors of the first conductivity type is always in an on state and one of the resistors carries current, the current consumption of the circuit may increase. The resistors may be separated from the supply voltage of the second voltage range by means of the additional transistors in order to allow the circuit to operate in an energy-saving operating mode. The energy-saving mode can be switched on and off by means of a voltage at the control input of the additional transistors. In both cases, the level converter is fully operational.

In an alternative exemplary embodiment, a first connection of a first resistor is connected to the output of the first signal path and a first connection of a second resistor is connected to the output of the second signal path. In this case, a second connection of the first resistor and a second connection of the second resistor are connected to a second supply potential connection via a common transistor having a control input that is connected to an activation input. The resistors which are again intended to be used to improve the switching behavior can thus be connected to the supply voltage of the second voltage range or separated from the supply voltage by means of a single transistor.

In one exemplary embodiment, in the mixing arrangement, the first input is coupled to the first signal output via an inverter, and the second input is coupled to the second signal output via a further inverter. In addition, in the mixing arrangement, the first input is coupled to the second signal output via two inverters which are connected in series, and the second input is coupled to the first signal output likewise via two inverters which are connected in series. As a result, the intermediate signals which are no longer completely complementary to one another can be combined to form the output signals which are complementary to one another.

In another exemplary embodiment, in the mixing arrangement, the first input is coupled to the first signal output via two inverters, and the second input is coupled to the second signal output via two inverters. Furthermore, the first input is coupled to the second signal output via a series circuit comprising an inverter and a resistor, and the second input is coupled to the first signal output via a series circuit comprising an inverter and a resistor.

In an alternative exemplary embodiment, in the mixing arrangement, the first input is coupled to the first signal output via an inverter, and the second input is coupled to the second signal output via a further inverter. In addition, the first and second signal outputs are coupled to one another via two inverters which are connected back to back.

In another exemplary embodiment, at least one second mixing arrangement for influencing a pulse width is connected downstream of the mixing arrangement. In this case, the second mixing arrangement comprises a first input which is coupled to the first signal output, and a second input which is coupled to the second signal output. The second mixing arrangement also has a first output and a second output for tapping off output signals. The first input of the second mixing arrangement is coupled to its first output and its second input is coupled to its second output. In addition, its first input is coupled to its second output and its second input is coupled to its first output via at least one respective inverter.

The switching behavior of the circuit arrangement can be improved even further by connecting a second mixing arrangement downstream, the function of said second mixing arrangement being identical to that of the first mixing arrangement. Slight temporal discrepancies in the switching behavior, which still remain after the first mixing arrangement, can be reduced further or eliminated by the second mixing arrangement. The internal design of the second mixing arrangement can be identical to that of the first mixing arrangement or can correspond to another embodiment.

The circuit arrangement can be used in a semiconductor memory in one of the embodiments described.

A pulsed push-pull signal having a first voltage swing from a first voltage range is converted into a first pulsed intermediate signal and into a second pulsed intermediate signal. The intermediate signals each have a second voltage swing from a second voltage range. Since, however, the intermediate signals are no longer completely complementary to one another under certain circumstances because the pulse widths of the intermediate signals no longer correspond to the pulse widths of the push-pull signal, the temporal discrepancies in the pulse widths must be compensated for. To this end, output signals are derived from the intermediate signals. In this case, the first output signal is derived from the first intermediate signal, the pulse width of the first output signal also being influenced by the pulse width of the second intermediate signal. In the same way, the second output signal is derived from the second intermediate signal, the pulse width of the second output signal being influenced by the pulse width of the first intermediate signal in this case too.

As a result, the temporal discrepancies in the pulse widths can be compensated for, with the result that the signal levels of the output signals are complementary to one another. A pulsed signal from a first voltage range can thus be converted into a signal from a second voltage range, the duty ratio being distorted to a relatively small extent as a result of the pulse widths in the output signal influencing one another.

In one exemplary embodiment, the supplying operation comprises supplying a first pulsed input signal which has a first voltage swing, and supplying a second pulsed input signal, the second input signal having the first voltage swing and a signal level that is complementary to the first input signal with regards to a first reference level. In addition, the conversion operation comprises converting the input signals.

The pulsed push-pull signal may be formed from two pulsed input signals. The logic signal levels of the two input signals are complementary to one another, that is to say when one input signal has a high level, for example, the other input signal has a low level. In this case, the logic levels each correspond to a particular voltage and the difference between the two voltages is the voltage swing of the pulsed signal. For example, the voltage for a high level corresponds to the supply potential of the first voltage range and the voltage for a low level corresponds to the reference potential of the first voltage range. In this case, the voltages for high and low levels are symmetrical with regards to a reference voltage between the two voltages, that is to say the voltage of the high level is higher than the reference voltage by that magnitude by which the voltage of the low level is lower than said reference voltage. Both the voltage of the high level and the voltages of the low level and of the reference level can be different from one another between the first and second voltage ranges.

In another exemplary embodiment, the operation of supplying the second input signal comprises deriving the second input signal from the first input signal. For example, the second input signal is derived, via an inverter which is supplied with a voltage from a first voltage range, in such a manner that the second input signal likewise has the first voltage swing and a signal level that is complementary to the first input signal.

In another exemplary embodiment, the operation of deriving a first pulsed output signal comprises deriving the first output signal from the first intermediate signal and from a signal having a signal level that is partially complementary to the first intermediate signal with regards to a second reference level. In addition, the operation of deriving a second pulsed output signal comprises deriving the second output signal from the second intermediate signal and from a signal having a signal level that is partially complementary to the second intermediate signal as regards the second reference level.

The output signals are first of all derived from the respective intermediate signals. However, the intermediate signals are generally not completely complementary to one another. The first intermediate signal may thus have a high level for a short period of time, while the second intermediate signal has a low level for a relatively long period of time. The second intermediate signal is thus partially complementary to the first intermediate signal. This also does not change, for example, when the second intermediate signal is inverted. However, a combined output signal having a desired pulse width, which corresponds approximately to a pulse width of a clock signal, can be derived from the first intermediate signal and from the inverted second intermediate signal. As a result, the duty ratio of the output signals is improved in comparison with the intermediate signals in which only the voltage swing for the second voltage range was adapted.

Although only some specific refinements of the invention were illustrated and described, a person skilled in the art can readily see that any arrangement which is suitable for implementing the proposed principle can be replaced with the refinements specified. It becomes clear to a person skilled in the art that the above description is used, in particular, to explain the inventive principle and is thus not restrictive either. In particular, it is not restricted to the designs of the invention described.

The application covers all modifications and variations of the invention. Combinations of the above refinements and further designs readily emerge for a person skilled in the art with the aid of the above description. The field of the invention also extends to applications which use the arrangements and methods disclosed. The scope of the invention should be determined taking into account the claims together with the equivalence range resulting from the claims.

It is emphasized that the abstract is enclosed in order to fulfill 37 C.F.R. §1.72(b), which requires an abstract that makes it possible for a reader to quickly grasp the fundamental aspects of the technical teaching disclosed. It is submitted in the knowledge that the abstract is not used to interpret and restrict the scope of protection or significance of the claims.

What is claimed is:

1. A circuit arrangement for converting logic signal levels, said circuit arrangement comprising:
   a level converter comprising:
      a first signal path and a second signal path each having a series circuit comprising a transistor of a first conductivity type and a transistor of a second conductivity type;
      a first signal input and a second signal input for supplying a push-pull signal;
      a first output coupled to a tap between the transistors of the series circuit of the first signal path;
      a second output coupled between the transistors of the series circuit of the second signal path;
      wherein the transistors of the first conductivity type can be controlled by means of the push-pull signal; and
      wherein the transistors of the second conductivity type in a respective one of the two signal paths can be controlled by means of a signal at the output of the respective other signal path;
   a third signal path that is coupled between the output of the first signal path and a second supply potential connection and comprises a first resistor and a further transistor that is coupled in series with the first resistor and has a control input that is coupled to an activation input;
   a fourth signal path that is coupled between the output of the second signal path and the second supply potential connection and comprises a second resistor and a further transistor that is coupled in series with the second resistor and has a control input that is coupled to the activation input; and
   a mixing arrangement for influencing comprising:
      a first input that is coupled to the first output of the level converter;
      a second input that is coupled to the second output of the level converter; and
      a first signal output and a second signal output for tapping off output signals;
      wherein the first input is coupled to the first signal output and the second input is coupled to the second signal output;
      wherein the first input is coupled to the second signal output via at least one inverter; and
      wherein the second input is coupled to the first signal output via at least one inverter.

2. The circuit arrangement as claimed in claim 1, further comprising:
   a first transistor and a second transistor of the same conductivity type;
      wherein the first transistor couples a first supply potential connection to the output of the first signal path;

wherein the second transistor couples the first supply potential connection to the output of the second signal path; and wherein the first and second transistors can be controlled using the push-pull signal.

3. The circuit arrangement as claimed in claim 1, wherein in the mixing arrangement:

the first input is coupled to the first signal output via a first inverter;

the second input is coupled to the second signal output (212) via a second inverter;

the first input is coupled to the second signal output via a first pair of inverters that are connected in series; and the second input is coupled to the first signal output via a second pair of inverters that are connected in series.

4. The circuit arrangement as claimed in claim 1, wherein in the mixing arrangement:

the first input is coupled to the first signal output via a first pair of inverters;

the second input is coupled to the second signal output via a second pair of inverters;

the first input is coupled to the second signal output via a first series circuit comprising an inverter and a resistor; and the second input is coupled to the first signal output via a second series circuit comprising an inverter and a resistor.

5. The circuit arrangement as claimed in claim 1, wherein in the mixing arrangement:

the first input is coupled to the first signal output via a first inverter;

the second input is coupled to the second signal output via a second inverter; and the first and second signal outputs are coupled to one another via a pair of inverters that coupled back to back.

6. The circuit arrangement as claimed in claim 1, further comprising at least one second mixing arrangement coupled downstream of the mixing arrangement, said second mixing arrangement comprising:

a first input that is coupled to the first signal output;

a second input that is coupled to the second signal output; and a first output and a second output for tapping off output signals;

wherein the first input of the second mixing arrangement is coupled to the first output of the second mixing arrangement and the second input of the second mixing arrangement is coupled to the second output of the second mixing arrangement;

wherein the first input of the second mixing arrangement is coupled to the second output of the second mixing arrangement via at least one inverter; and wherein the second input of the second mixing arrangement is coupled to the first output of the second mixing arrangement via at least one inverter.

7. A circuit arrangement for converting logic signal levels, said circuit arrangement comprising:

a level converter comprising:

a first signal path and a second signal path each having a series circuit comprising a transistor of a first conductivity type and a transistor of a second conductivity type;

a first signal input and a second signal input for supplying a push-pull signal;

a first output coupled to a first tap between the transistors of the series circuit of the first signal path series;

a second output coupled to a second tap between the transistors of the series circuit of the second signal path;

wherein the transistors of the first conductivity type can be controlled by means of the push-pull signal;

wherein the transistor of the second conductivity type the first signal path can be controlled by means of a signal at the second output;

wherein the transistor of the second conductivity type in the second signal path can be controlled by means of a signal at the first output;

wherein a first connection of a first resistor is coupled to the first output;

wherein a first connection of a second resistor is coupled to the second output; and wherein a second connection of the first resistor and a second connection of the second resistor are coupled to a second supply potential connection via a common transistor having a control input that is coupled to an activation input (110); and a mixing arrangement, said mixing arrangement comprising:

a first input coupled to the first output of the level converter;

a second input coupled to the second output of the level converter; and a first signal output and a second signal output for tapping off output signals;

wherein the first input is coupled to the first signal output and the second input is coupled to the second signal output;

wherein the first input is coupled to the second signal output via at least a first inverter; and wherein the second input is coupled to the first signal output via at least a second inverter.

8. The circuit arrangement as claimed in claim 7, further comprising:

a first transistor and a second transistor of the same conductivity type;

wherein the first transistor couples a first supply potential connection to the output of the first signal path;

wherein the second transistor couples the first supply potential connection to the output of the second signal path; and wherein the first and second transistors can be controlled using the push-pull signal.

9. The circuit arrangement as claimed in claim 7, wherein at least one second mixing arrangement is coupled downstream of the mixing arrangement, said second mixing arrangement comprising:

a first input coupled to the first signal output;

a second input coupled to the second signal output; and a first output and a second output for tapping off output signals;

wherein the first input of the second mixing arrangement is coupled to the first output of the second mixing arrangement and the second input of the second mixing arrangement is coupled to the second output of the second mixing arrangement;

wherein the first input of the second mixing arrangement is coupled to the second output of the second mixing arrangement via at least a third inverter; and wherein the second input of the second mixing arrangement is coupled to the first output of the second mixing arrangement via at least a fourth inverter.

10. The circuit arrangement of claim 7, wherein the mixing arrangement comprises a mixing arrangement for influencing a pulse width.

11. A method for converting logic signal levels, said method comprising:

supplying a pulsed push-pull signal having a first voltage swing;

converting the push-pull signal into a first pulsed intermediate signal and into a second pulsed intermediate signal each having a second voltage swing, a supply voltage that is used for conversion being provided based as a function of an activation signal;

deriving a first pulsed output signal having the second voltage swing from the first intermediate signal, a pulse width of the first output signal being influenced by a pulse width of the second intermediate signal; and deriving a second pulsed output signal having the second voltage swing from the second intermediate signal, a pulse width of the second output signal being influenced by a pulse width of the first intermediate signal.

12. The method as claimed in claim 11, wherein supplying a pulsed push-pull signal comprises supplying a first pulsed input signal that has a first voltage swing, and supplying a second pulsed input signal, the second input signal having the first voltage swing and a signal level that is complementary to the first input signal; and converting the push-pull signal comprises converting the input signals.

13. The method as claimed in claim 12, wherein supplying the second input signal comprises deriving the second input signal from the first input signal.

14. The method as claimed in claim 11, wherein deriving a first pulsed output signal comprises deriving the first output signal from the first intermediate signal and from a signal having a signal level that is partially complementary to the first intermediate signal as regards a second reference level; and wherein deriving a second pulsed output signal comprises deriving the second output signal from the second intermediate signal and from a signal having a signal level that is partially complementary to the second intermediate signal as regards the second reference level.

* * * * *

UNITED STATES PATENT AND TRADEMARK OFFICE
CERTIFICATE OF CORRECTION

PATENT NO.        : 7,414,435 B2
APPLICATION NO.   : 11/638089
DATED             : August 19, 2008
INVENTOR(S)       : Kuzmenka et al.

It is certified that error appears in the above-identified patent and that said Letters Patent is hereby corrected as shown below:

In Col. 5, line 28, delete "12" and insert --I2--.
In Col. 13, line 35 claim 5, after "that" insert --are--.
In Col. 14, line 3 claim 17, after "type" insert --in--.

Signed and Sealed this

Fourth Day of November, 2008

JON W. DUDAS
*Director of the United States Patent and Trademark Office*